(12) United States Patent
Gayazov et al.

(10) Patent No.: US 8,018,574 B2
(45) Date of Patent: Sep. 13, 2011

(54) LITHOGRAPHIC APPARATUS, RADIATION SYSTEM AND DEVICE MANUFACTURING METHOD

(75) Inventors: Robert Rafilevitch Gayazov, Troitsk (RU); Vadim Yevgenyevich Banine, Helmond (NL); Vladimir Vitalevitch Ivanov, Moscow (RU); Evgenii Dmitreevitch Korob, Troitsk (RU); Konstantin Nikolaevitch Koshelev, Troitsk (RU); Givi Georgievitch Zukavishvili, Troitsk (RU); Yurii Victorovitch Sidelnikov, Troitsk (RU)

(73) Assignee: ASML Netherlands B.V., Veldhoven (NL)

( * ) Notice: Subject to any disclaimer, the term of this patent is extended or adjusted under 35 U.S.C. 154(b) by 888 days.

(21) Appl. No.: 11/170,788

(22) Filed: Jun. 30, 2005

(65) Prior Publication Data

US 2007/0001126 A1  Jan. 4, 2007

(51) Int. Cl.
*G03B 27/42* (2006.01)
(52) U.S. Cl. .................. 355/53; 250/505.1; 378/156
(58) Field of Classification Search .................. 355/53; 250/505.1; 378/156, 158, 147–149, 85, 119
See application file for complete search history.

(56) References Cited

U.S. PATENT DOCUMENTS

| 5,530,613 A * | 6/1996 | Bauer et al. ............ 361/58 |
| 6,359,969 B1 | 3/2002 | Shmaenok ............ 378/156 |
| 2002/0084428 A1 | 7/2002 | Visser et al. |
| 2004/0099820 A1* | 5/2004 | Bristol ............ 250/493.1 |
| 2005/0016679 A1* | 1/2005 | Ruzic et al. ............ 156/345.5 |
| 2005/0230645 A1* | 10/2005 | Melnychuk et al. ...... 250/504 R |
| 2006/0012761 A1* | 1/2006 | Bakker et al. ............ 355/30 |
| 2006/0138362 A1* | 6/2006 | Bakker et al. ............ 250/504 R |

FOREIGN PATENT DOCUMENTS

| DE | 102 37 901 B3 | 5/2004 |
| EP | 1 211 918 A1 | 6/2002 |
| EP | 1 309 234 A2 | 5/2003 |
| EP | 1 491 963 A1 | 12/2004 |
| EP | 1 274 287 B1 | 6/2005 |
| JP | 2001-068297 | 3/2001 |

OTHER PUBLICATIONS

Partial European Search Report issued for European Patent Application No. 04076841.8-1226, dated Nov. 9, 2004.

* cited by examiner

*Primary Examiner* — Edward J Glick
*Assistant Examiner* — Mesfin T Asfaw
(74) *Attorney, Agent, or Firm* — Pillsbury Winthrop Shaw Pittman LLP

(57) ABSTRACT

A foil trap is located in a path of a radiation beam. The foil trap includes an array of conductive strips. A voltage application circuit is coupled to the strips to apply voltage differences between pairs of adjacent ones of the strips. The voltage application circuit includes a current limiting circuit arranged to limit currents to the strips to values below a threshold value above which self-sustained arc discharge may arise in the foil trap.

25 Claims, 3 Drawing Sheets

LITHOGRAPHIC APPARATUS, RADIATION SYSTEM AND DEVICE MANUFACTURING METHOD

FIELD

The present invention relates to a lithographic apparatus, a radiation system and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of one, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

European Patent Application No. 1 491 963 and U.S. Patent Application Publication No. 2002084428 disclose a lithographic apparatus that comprises a contamination trap, also called "foil-trap". The foil trap is placed in the path of the radiation beam and contains a plurality of strips (also called lamellas), which are positioned so that the radiation beam is able to pass through spaces between the strips. Typically, the strips are arranged as spokes on a hub that is located on the central axis of the radiation beam. The strips of the foil trap serve to trap unwanted matter that would otherwise cause damage to the optical elements (typically mirrors) that are used to condition the beam for projection of the pattern onto the substrate. The sequentially first optical element, the collector mirror that gathers the radiation from the plasma source is particularly at risk.

A preferred EUV radiation source is a plasma source. A major problem with this type of radiation source is that accelerated particles can be launched from the source into the path of the beam. Fast plasma or charged debris particles can be launched into the path of the beam, for example. Particles or ions/neutrals or plasma may include working material of the source, such as Sn, Xe, . . . or material from area's close to the emitting region such as Mo, W, and/or Fe.

As described in EP 1 491 963 and US2002084428, a foil trap between the plasma source and the collector mirror addresses part of this problem. The foil trap intercepts debris that does not travel in parallel with the beam. Moreover, debris that travels in parallel with the beam can be trapped by introducing gas in into the foil trap. EP 1 491 963 describes an embodiment wherein the strips of the foil trap are charged to mutually different voltages so as to create electric fields between the strips transverse to the direction of the radiation beam. This is done to trap fast charged particles, such as Xe ions that emerge from the plasma source. As described in this document, the electric field between the strips applies to the particles that travel through the foil trap, giving them an azimuthal velocity component towards the strips.

Reliance on this effect tacitly assumes that no plasma exists between the lamella, because a plasma would result in a spatial charge distribution that counteracts the external electric field from the strips. Therefore, the electrically charged foil trap of EP 1 491 963 and US2002084428 relies on the fact that density of charged particles is too low to create plasma inside of a foil trap.

SUMMARY

It is desirable to provide for a lithographic apparatus with a contamination barrier, or foil trap, that suppresses charged particles in the form of plasma that travel with the radiation beam, as well as ions traveling before or after such a plasma.

According to an aspect of the invention, there is provided a lithographic apparatus for projecting a radiation beam onto a substrate, the lithographic apparatus comprising: a contamination barrier located in a path of the radiation beam, the contamination barrier comprising an array of conductive strips; a voltage application circuit coupled to the strips, for applying voltage differences between pairs of adjacent ones of the strips, the voltage application circuit comprising a current limiting circuit arranged to limit currents to the strips to values below a threshold value above which self-sustained arc discharge will arise in the contamination barrier.

According to another aspect of the invention there is provided a lithographic apparatus for projecting a radiation beam onto a substrate, the lithographic apparatus comprising: a contamination barrier located in a path of the radiation beam, the contamination barrier comprising a first and second stage, the second stage being positioned downstream of the first stage relative to a direction of propagation of the radiation beam, the first stage comprising a first array of first conductive strips and the second stage comprising a second array of second conductive strips and/or conductive extensions of first conductive strips, at least part of the second conductive strips and/or extensions being electrically controllable distinguishably from the first conductive strips; a voltage application circuit, coupled to the first and second conductive strips and/or extensions, for applying first voltage differences between pairs of adjacent ones of the first conductive strips, and for applying voltages to the second conductive strips and/or extensions so that second voltage differences between adjacent second conductive strips and/or extensions, if any, are less than the first voltage differences.

According to yet another aspect of the invention there is provided a radiation system for providing a conditioned beam of radiation, the system comprising: a radiation source for generating a radiation beam; a contamination barrier located in a path of the radiation beam, the contamination barrier comprising an array of conductive strips; a voltage application circuit coupled to the strips, for applying voltage differences between pairs of adjacent ones of the strips, the voltage application circuit comprising a current limiting circuit arranged to limit currents to the strips to values below a threshold value above which self-sustained arc discharge may arise in the contamination barrier.

According to another aspect of the invention there is provided a device manufacturing method wherein a beam of radiation is projected onto a substrate, wherein the beam is passed through a contamination barrier that comprises a plurality of conductive strips, the method comprising: applying voltage differences between pairs of adjacent strips; limiting currents through the strips to values below a threshold value above which self-sustained arc discharge may arise in the contamination barrier.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
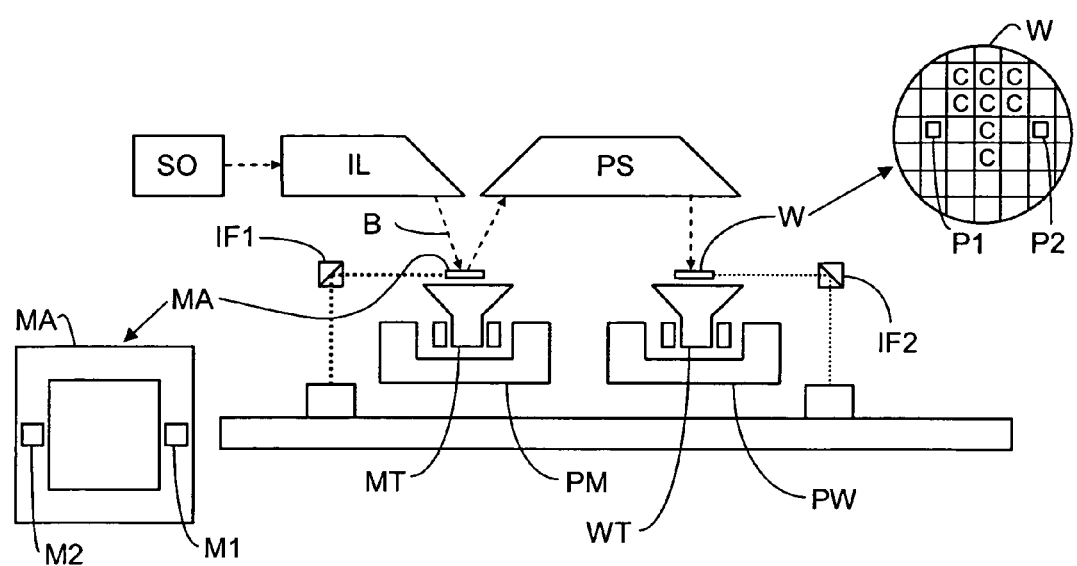
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable minor arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small minors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
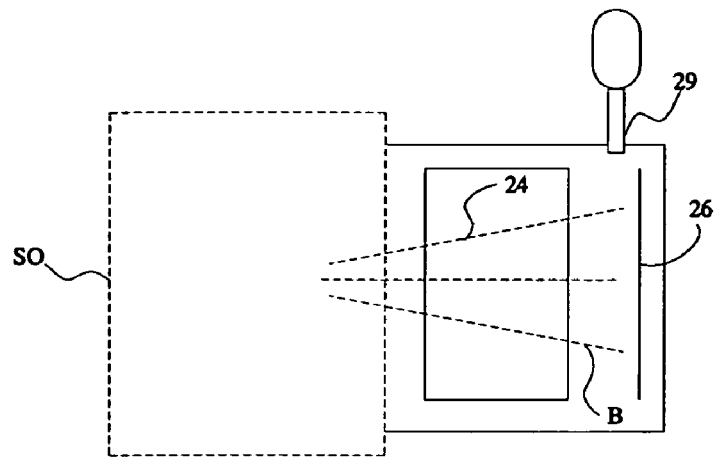
FIG. 2 depicts a radiation source.

FIG. 2 shows source SO, a foil trap 24, a reflective collector lens 26 (a mirror) and a gas source 29. The radiation beam B runs from source SO through foil trap 24 to collector lens 26 and from there (not shown) on to further optical elements, the reticle, projection optics and finally on to the substrate. After emerging source SO, beam B travels to collector lens 26 via foil trap 24. Gas source 29 is arranged to supply gas in the beam path, including into foil trap 24. These components are located in a walled compartment that is operated under near vacuum conditions. Typically a pump (not shown) is coupled to the compartment to pump out gas.

Source SO may be a Discharge Produced Plasma source (DPP) or a Laser Produced Plasma source (LPP), for example. Usually, the discharge sources contain an anode and a cathode and EUV is generated by contracted plasma production in between the anode and cathode. Typically, radiation can be emitted either through a hole in the electrodes or from the gap between the electrodes. In the case of LPP, the EUV radiated plasma is created by eradiation of a suitable material by the pulsed laser.

Figure 3:
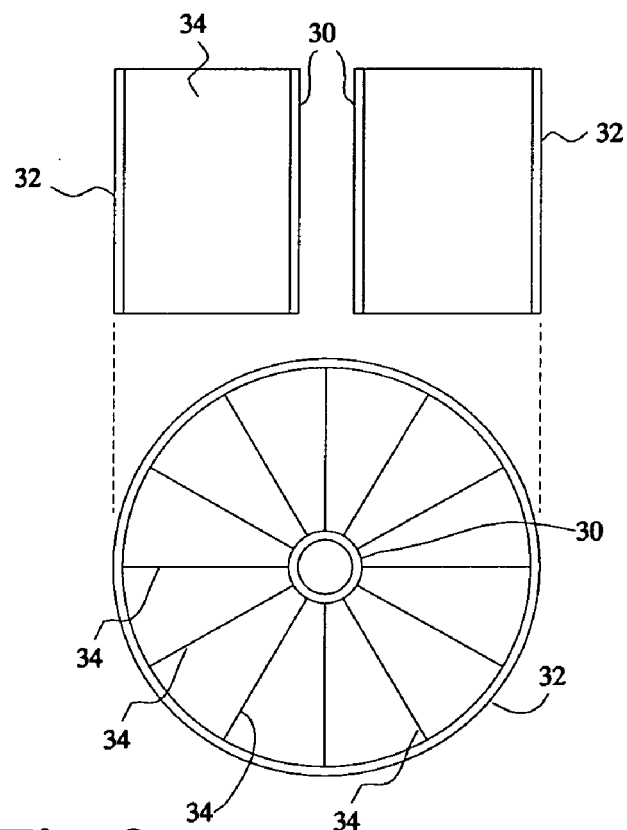
FIG. 3 depicts a foil trap.

FIG. 3 schematically illustrates an implementation of foil trap 24 in cross-section and in front view. More detail about the construction of foil traps may be found in, for example, European patent application No 1 491 963. Foil trap 24 comprises an inner ring 30, an outer ring 32 and strips 34 connected radially between inner ring 30 and outer ring 32. Although, for the sake of clarity, an embodiment with a small number of strips 34 has been shown, it should be appreciated that a larger number of strips can be used. In an embodiment, the number of strips 34 is so that the distance between adjacent strips 34 is approximately one millimeter at inner ring 30. Strips 34 are oriented substantially in parallel with the directions of radiation that emanates from source SO, and each is constructed to intercept matter that moves transverse to those directions.

Gas source 29 is provided so as to supply gas in the beam path, including into foil trap 24, so that a gas flow is created in the direction away from the optics to trap and/or drag away contaminant particles. Preferably, a pump (not shown) has an input at the side of foil trap 24 opposite gas source 29 to maintain the gas flow. The components are located in a walled compartment that is operated under near vacuum conditions. EUV source operation, as well as conditions of transparency for EUV, require relatively low pressure (0.001-0.1 mbar). The gas flow serves to drag off matter from the path of the beam before it reaches collector lens 26. Although a gas flow is preferably used for this purpose, it should be appreciated that the gas flow and therefore gas source 29 may be omitted under some circumstances.

Figure 4:
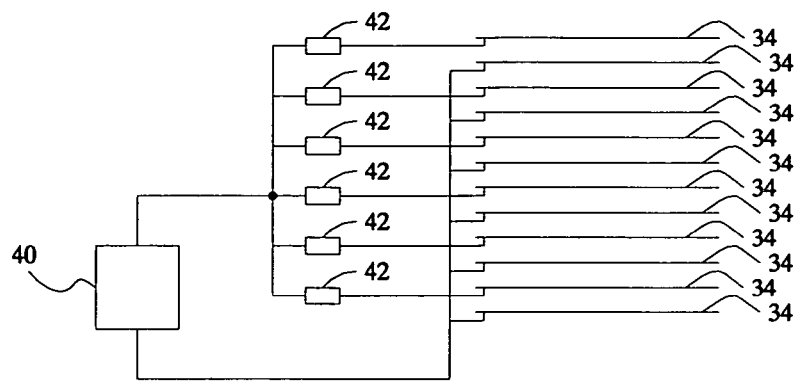
FIG. 4 depicts a voltage application circuit.

FIG. 4 shows an electric circuit wherein strips 34 are connected. The circuit comprises a voltage source 40 and resistors 42. A number of strips 34 is shown schematically as a stack, but it should be realized that strips 34 may in fact be arranged radially around a center. A first terminal of voltage source 40 is coupled to a first sub-set of the strips and a second terminal of voltage source 40 is coupled to a second subset of the strips, each via a respective one of the resistors 42. In the foil trap, one strip of the second subset is interposed between each pair of strips of the first subset. Thus, going around the circle in the front view of FIG. 3, alternately strips of the first and second subset will be encountered.

Voltage source 40 generates a voltage between its terminals. Preferably the voltage is in a range from 100-1000 Volts. In practical foil traps, this corresponds to field strengths in the range of 30-1000 Volts per millimeter.

It has been found that a big portion of plasma in the foil trap may be dissipated by enhanced ambipolar diffusion and that this may result in a circuit current that may reach a rather high value. The high current entails a danger that a regime of non-controlled self-sustained arc discharge may be entered if the current density exceeds some threshold value. Resistors 42 restrict the maximum current for respective pairs of strips and prevent uncontrollable concentration of the total current in a sole pair of strips.

More generally, resistors 42 serve as current limiting circuits. "Current limiting circuit" as used herein does not necessarily imply that the relevant circuits impose a definite upper limit, the term is also used for circuits that prevent the growth of current fluctuations that would otherwise grow very large. Alternative implementations of current limiting circuits could include, for example, switching circuits, to switch off application of the voltage temporarily after a current rise, or a non-linear circuit, for example, a circuit that reduces the voltage substantially only once the current exceeds a threshold, or reacts more strongly once a threshold is exceeded. Similarly, the current limiting circuit may contain a dynamically limiting circuit such as an inductor between voltage source 40 and a strip 34 in a circuit that reduces the voltage applied to a strip 34 in response to a current surge.

Suitable resistor values depend on practical circumstances such as the configuration of the lamella, gas pressure, radiation intensity, etc. Dependent on these circumstances, a certain minimum resistor value is needed, selected so that the maximum possible current is below a threshold value above which non-controlled self-sustained arc discharge may arise under the operational conditions that exist in the foil trap. The required resistor values can be determined experimentally by testing increasingly higher resistor values until development of short circuits between strips 34 is no longer detected. For example, in one experiment wherein the distance between strips 34 was 1 millimeter, the width of strips 34 in the direction of beam B was 14 millimeter and argon at a pressure of 0.004 mbar was present between strips 34, resistor values of 1 kiloohm were found to work satisfactorily. But of course the invention is not limited to this example.

It should be noted that the use of current limiting circuits like resistors 42 would not be contemplated without the insight that a plasma may arise between the strips. Even with the insight of the possible existence of a plasma between strips 34, the obvious conclusion would be that the application of a voltage difference between strips 34 would serve no purpose, since polarization of such a plasma prevents penetration of an electrical field, so that a voltage difference between strips 34 does not serve to deflect ions by applying an external force to the ions. Nevertheless the ambipolar diffusion enhanced by an applied electrical field is able to dissipate this plasma by attracting positively charged ions to the negative electrode and electrons from the plasma to the ground electrode. By this mechanism, not only can single ions be deflected (stopped) but also comparatively dense plasma can be destroyed during the time it passes between (along) foil trap strips.

Actually, ambipolar diffusion will destroy plasma even without application of a voltage difference between strips 34, but in a presence of voltage differences, this process is much more efficient. In this way, the electric field aids in the interception, even though there is little or no electric field strength in the space between strips 34, because the charge distribution in the plasma acts to compensate the effect of the voltage difference between the strips in all but a small region near the surface of strips 34.

As shown in FIG. 4, the currents to different strips 34 from the second subset of strips that is coupled to a terminal of voltage source 40 are preferably limited separately from one another. As an alternative, a shared resistor (or other current limiting circuit) could be placed in series between voltage source 40 and all of strips 34 in the second subset. As another alternative, current limiting elements could be used between voltage source 40 and respective groups, each of less than all of strips 34. However, use of current limiting elements that are separately operable for respective strips has the advantage that a remainder of the foil trap remains maximally operational when a current surge is suppressed if current is limited for one strip. Moreover, if too many strips 34 are coupled to a same current limiting circuit, problems may arise that an effective current limitation circuit impedes normal operation.

Although an embodiment of the invention has been described wherein resistances 42 are used to realize current limitations, it should be realized that alternative current limitation circuits could be used. For example, more complicated circuits containing a resistor could be used, e.g. with several resistances in series or in parallel. As another example a non-linear component may be used which responds approximately resistively for small current variations. Furthermore, current source circuits may be used, which keep the currents to strips 34 approximately constant, as long as they are not below a minimum current level. Furthermore, instead of resistors 42, control circuits may be used that regulate the voltage at the strips so that this voltage is reduced when the current grows beyond a threshold or grows at a rate beyond a threshold.

Furthermore, although only one voltage source 40 has been used to apply voltage differences between all pairs of successive strips 34, it should be realized that separate voltage sources could be used for different pairs of strips. Similarly, although only two different voltages are applied to strips 34, it should be realized that a greater number of voltages could be used, applying for example a first voltage to first strips, a second, higher voltage to second strips adjacent the first strips and a yet higher third voltage to third strips between the second strips. Furthermore, although resistors 42 have been shown only in the connections to strips 34 of the second subset, it should be realized that additional resistors, or other current limiting circuits may be used in the connections to strips of the first subset.

Preferably, the voltages of all strips 34 are kept at values relative to the voltages in the remainder of the apparatus so that electric fields, if any, between strips 34 and the remainder of the apparatus are directed towards strips 34. This may have the advantage that free electrons are repelled or at least not attracted. Preferably one electrode from every pair of adjacent strips is connected to ground potential of the apparatus and the second is negatively charged.

Dissipation of plasma in the electrical field between strips may result in accumulation of tin (or other material from the discharge) atoms on the surface of the negatively charged strips of the foil-trap. Under some circumstances this may lead to problems. Ions accelerated from plasma may have energy sufficient for secondary etching of atoms of neutral tin from the surface of strips. This may result in liberation of neutral atoms that are not affected by electrical field. These atoms may freely penetrate behind the foil trap and deposit on optical elements. This effect can seriously restrict the mitigation effect of an electrostatic foil trap combination.

If necessary, this effect can be reduced by using a gas or gas flow inside the foil trap to stop propagation of these atoms resulting from the secondary etching. As "secondary" atoms are expected to be slow a stopping gas efficiency may be quite high, since the stopping efficiency is much stronger for slow atoms than for fast ions. Thus the gas flows needed in this case are much lower than used in conventional gas foil traps and thus will induce much lower problems for gas pumping systems.

Figure 5:
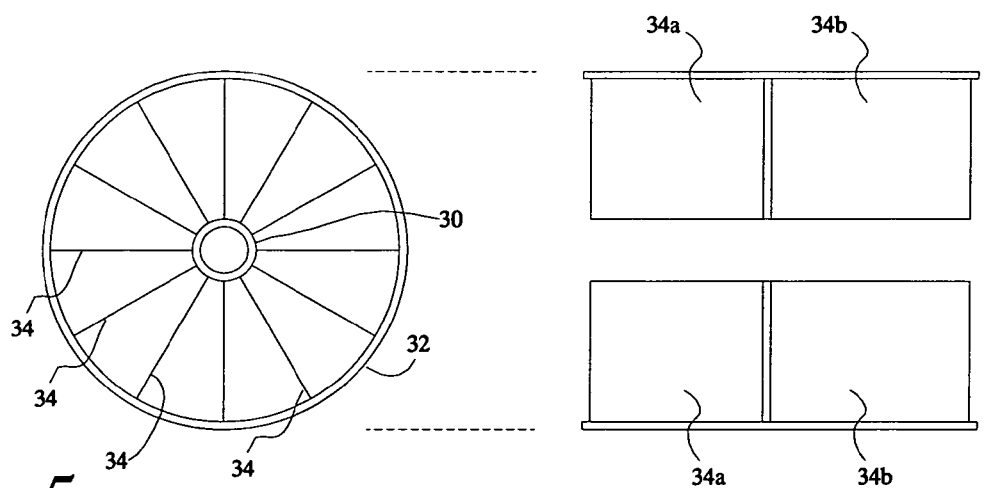
FIG. 5 depicts a foil trap.

FIG. 5 shows an embodiment wherein the foil trap has a two stage structure. The foil trap is shown in cross-section through a virtual plane through its axis. This structure may be used as an alternative or additional solution for solving the problem due to secondary etching. Strips 34 comprise a first and second strip stage 34a, 34b. First strip stage 34a and second strip stage 34a are located relatively closer and further, respectively, from the EUV source (not shown) along the foil trap. A circuit as described above is coupled to the first strip stages 34a, so that voltage differences will be applied between adjacent pairs of first strip stages 34a. Second strip stages 34b are coupled to a source or sources of same voltage (preferably ground), so that substantially no voltage differences are applied between adjacent second strip stages 34b.

In operation, in a first part of the foil trap, between first strip stages 34a, plasma coming from the source (not shown) will be dissipated by enhanced ambipolar diffusion. As a side effect this may cause secondary etching of tin atoms that have been accumulated previously on the surfaces of the strips, due to plasma accelerated by ambipolar diffusion gradient. A second part of the foil trap, between second strip stages 34b has no electric field. Gas in this second part serves as a diffusion barrier for the tin atoms. Under influence of EUV radiation of the beam, the gas may be ionized which even increases the stopping power of the second stage of the foil trap. Of course, this applies also if other materials than tin suffer from secondary etching. Even without a gas, the second part of the foil trap may reduce the problem to some extent by increasing the probability that the tin is deposited before it reaches the collector lens.

Preferably second strip stage 34b has a length of between 10-40 millimeter, and more preferably between 10-20 millimeter. This is sufficiently long to realize a diffusion barrier. A longer second strip stage may also be used, but it is preferred to use the available space for first strip stage 34a. However, in general, the maximum length of the second strip 34b will be determined by the distance between the side of the second strip stage 34b facing the first strip stage 34a and the collector optics. In an example, first strip stage 34a has a length of 30 millimeter in the direction of the beam and second strip stage 34b has a length of 10 millimeter.

In comparison with gas filled foil traps without electric fields, this two stage foil trap can be operated with the same effect as the gas filled foil traps, but at significantly lower operation pressure (e.g. ten times less) and thus lower load on pumping system, and potentially achieve higher mitigation of the slow and low amount of debris, which might be produced by applying a field related foil trap. Using a combination of electric fields and gas will significantly increase the lifetime of the collector optics.

Although the same voltage is preferably applied to second strip stages 34b, it should be realized that, compared to a single stage foil trap, a reduction of the problems due to secondary etching is realized when small voltage differences are applied between adjacent second strip stages 34b, which are smaller than the voltage differences between first strip stages 34a. Furthermore, although two stages are shown, it should be realized that more stages may be used. Furthermore, although the first and second strip stages are preferably aligned with one another in the direction of the beam, so that second strip stages 34b are "in the shadow of" first strip stages 34a (do not intercept radiation that from directions that are not blocked by first strip stages 34a), it should be realized that, without deviating from the invention a different arrangement may be used, wherein the first and second strip stages 34a, 34b are not aligned.

Even if first and second strip stages 34a, 34b are aligned it is not necessary that a second strip stage 34b is provided behind each first strip stage 34a, or vice versa: some first strip stages 34a may not be followed by a second strip stage 34b, or vice versa.

Furthermore, although strips have been shown that contain respective parts that are electrically isolated from one another to realize the two stages, it should be realized that complete electrical isolation is not necessary. A resistive connection between the strip parts suffices, since this allows a voltage difference to be applied so that the voltage differences between neighboring strips in different stages of the foil trap can be made different. Furthermore not all strips need to comprise a plurality of mutually isolated or resistively connected parts. In one embodiment, only every second strip is split into parts or has electrically connected parts, the other strips need not have split parts. By applying different voltages to the parts of the strips that are split, the voltage difference between neighboring strips in different stages can be made different.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus for projecting a radiation beam onto a substrate, the lithographic apparatus comprising:
    a contamination barrier located in a path of the radiation beam, the contamination barrier comprising an array of conductive strips; and
    a voltage application circuit coupled to the strips, and arranged to apply voltage differences in a range of a hundred to a thousand volts between pairs of adjacent ones of the strips to enhance ambipolar diffusion and dissipation of plasma between adjacent strips, the voltage application circuit comprising a current limiting circuit arranged to limit currents to the strips to values below a threshold value above which self-sustained arc discharge will arise in the contamination bather.

2. A lithographic apparatus according to claim 1, wherein the current limiting circuit comprises a plurality of sub-circuits, each coupled to a respective one of the strips and arranged to limit the current to that respective one of the strips substantially independent of currents of strips that are coupled to other ones of the sub-circuits.

3. A lithographic apparatus according to claim 1, wherein the voltage application circuit is arranged to apply voltages to the strips that are all so low relative to voltages applied to a remainder of the apparatus that substantially any electric fields between the strips and the remainder of the apparatus are directed towards the strips, whereby electrons are repelled from the strips, or at least not attracted.

4. A lithographic apparatus according to claim 1, further comprising a gas source arranged to introduce a gas flow into at least spaces between pairs of the strips with a gas flow direction against a direction of propagation the radiation beam.

5. A lithographic apparatus according to claim 4, wherein the strips form a first stage of the contamination barrier, the contamination barrier comprising a second stage positioned downstream of the first stage relative to a direction propagation of the radiation beam, the second stage comprising a second array of further conductive strips, or conductive extensions of strips of the first stage, or both, at least part of the further conductive strips, or extensions, or both, being electrically controllable distinguishably from the strips of the first array, the apparatus being arranged to maintain voltages at the further conductive strips, or extensions, or both, so that further voltage differences between the voltages at adjacent strips, or extensions in the second stage, or both, if any, are less than the voltage differences between the strips in the first stage.

6. A lithographic apparatus according to claim 5, wherein the apparatus is arranged to maintain substantially zero further voltage differences between the further conductive strips, or extensions, or both, during operation.

7. A lithographic apparatus according to claim 1, wherein the strips have a width of at least ten millimeters in a direction of propagation of the beam.

8. A lithographic apparatus according to claim 1, wherein the voltage application circuit comprises a voltage source circuit with a first terminal coupled to a first plurality of the strips and a second terminal coupled to a second plurality of the strips that each lie in between a respective pair of strips from the first plurality, the second terminal being coupled to the strips of the second plurality via the current limiting circuit.

9. A lithographic apparatus according to claim 8, wherein the current limiting circuit comprises resistors, each coupled between the second terminal and a respective one of the strips of the second plurality.

10. A lithographic apparatus according to claim 9, wherein the resistors have a resistor value between a hundred ohm and ten kiloohm.

11. A lithographic apparatus according to claim 1, wherein the voltage difference has a value selected so that a ratio between the voltage difference and a distance between the strips is between thirty and a thousand volts per millimeter.

12. A radiation system for providing a conditioned beam of radiation, the system comprising:
    a radiation source arranged to generate a radiation beam;
    a contamination barrier located in a path of the radiation beam, the contamination barrier comprising an array of conductive strips; and
    a voltage application circuit coupled to the strips, and arranged to apply voltage differences in a range of a hundred to a thousand volts between pairs of adjacent ones of the strips to enhance ambipolar diffusion and dissipation of plasma between adjacent strips, the voltage application circuit comprising a current limiting circuit arranged to limit currents to the strips to values below a threshold value above which self-sustained arc discharge may arise in the contamination barrier.

13. A radiation system according to claim 12, wherein the current limiting circuit comprises a plurality of sub-circuits, each coupled to a respective one of the strips and arranged to limit the current to that respective one of the strips substantially independent of currents of strips that are coupled to other ones of the sub-circuits.

14. A radiation system according to claim 12, wherein the voltage application circuit is arranged to apply voltages to the strips that are all so low relative to voltages applied to a remainder of the system that substantially any electric fields between the strips and the remainder of the system are directed towards the strips, whereby electrons are repelled from the strips, or at least not attracted.

15. A radiation system according to claim 12, further comprising a gas source arranged to introduce a gas flow into at least spaces between pairs of the strips with a flow direction against a direction of propagation of the radiation beam.

16. A radiation system according to claim 15, wherein the strips a first stage of the contamination barrier, the contamination barrier comprising a second stage positioned downstream of the first stage relative to a direction of propagation of the radiation beam, the second stage comprising a second array of further conductive strips, or conductive extensions of strips of the first stage, or both, at least part of the further conductive strips, or extensions, or both, being electrically controllable distinguishably from the strips of the first stage, the system being arranged to maintain voltages at the further conductive strips, or extensions, or both, so that further voltage differences between the voltages at adjacent conductive strips, or extensions, or both, in the second stage, if any, are less than the voltage differences between the strips in the first stage.

17. A radiation system according to claim 16, wherein the system is arranged to maintain substantially zero voltage difference between the further conductive strips, or extensions, or both, in the second stage during operation.

18. A radiation system according to claim 12, wherein the strips have a width of at least ten millimeters in a direction of propagation of the beam.

19. A radiation system according to claim 12, wherein the voltage application circuit comprises a voltage source circuit with a first terminal coupled to a first plurality of the strips and a second terminal coupled to a second plurality of the strips that each lie in between a respective pair of strips from the first plurality, the second terminal being coupled to the strips of the second plurality via the current limiting circuit.

20. A radiation system according to claim 19, wherein the current limiting circuit comprises resistors, each coupled between the second terminal and a respective one of the strips of the second plurality.

21. A radiation system according to claim 20, wherein the resistors have a resistor value between a hundred ohm and ten kiloohm.

22. A radiation system according to claim 12, wherein the voltage difference has a value selected so that a ratio between the voltage difference and a distance between the strips is between thirty and a thousand volts per millimeter.

23. A device manufacturing method wherein a beam of radiation is projected onto a substrate, wherein the beam is passed through a contamination barrier that comprises a plurality of conductive strips, the method comprising:
applying voltage differences in a range of a hundred to a thousand volts between pairs of adjacent strips to enhance ambipolar diffusion and dissipation of plasma between adjacent strips; and
limiting currents through the strips to values below a threshold value above which self-sustained are discharge may arise in the contamination barrier.

24. A device manufacturing method according to claim 23, further comprising limiting the current to respective ones of the strips substantially independent of currents of other ones of the strips.

25. A device manufacturing method according to claim 23, wherein the voltage differences in a range of a hundred to thousand volts are applied between the strips.

* * * * *